United States Patent
Yeh et al.

(10) Patent No.: US 8,052,452 B2
(45) Date of Patent: Nov. 8, 2011

(54) SOCKET CONNECTOR HAVING CONNECTOR HOUSING WITH ENDS SLIGHTLY LIFTED OFF STIFFENER ENSURING DEFORMATION-FREE OPERATION

(75) Inventors: Cheng-Chi Yeh, Tu-Cheng (TW); Jia-Hau Liu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/626,508

(22) Filed: Nov. 25, 2009

(65) Prior Publication Data

US 2010/0130049 A1    May 27, 2010

(30) Foreign Application Priority Data

Nov. 25, 2008   (TW) ............... 97221050 U

(51) Int. Cl.
    *H01R 13/62* (2006.01)
(52) U.S. Cl. .......................................... 439/331; 439/70
(58) Field of Classification Search .............. 439/331, 439/70–73
    See application file for complete search history.

(56) References Cited

U.S. PATENT DOCUMENTS

| | | | |
|---|---|---|---|
| 7,001,197 B2 * | 2/2006 | Shirai et al. | ............... 439/331 |
| 7,179,092 B2 | 2/2007 | Ma | |
| 7,189,093 B2 * | 3/2007 | Ma | ............... 439/331 |

* cited by examiner

*Primary Examiner* — Truc Nguyen
(74) *Attorney, Agent, or Firm* — Andrew C. Cheng; Wei Te Chung; Ming Chieh Chang

(57) ABSTRACT

An electrical socket comprises an insulative housing, a stiffener defined around the insulative housing, a load plate and a load lever. The housing defines two supporting portions at two opposite sides, each of said supporting portions defining a mounting portion in a middle portion thereof. The stiffener comprises a first side, a second side opposite to the first side, a third side and a fourth side opposite to the third side, the third, fourth sides defined corresponding to the two supporting portions of the housing respectively and with an engaging portion engageable with the mounting portion, each of said third, fourth sides formed with an upwardly curved configuration at a middle portion thereof for supporting the supporting portion. The two supporting portions seat on the third, fourth sides respectively, thus making a gap formed between the supporting portions and opposite end of corresponding sides respectively.

9 Claims, 5 Drawing Sheets

SOCKET CONNECTOR HAVING CONNECTOR HOUSING WITH ENDS SLIGHTLY LIFTED OFF STIFFENER ENSURING DEFORMATION-FREE OPERATION

BACKGROUND OF THE INVENTION

1. Field of the Invention

The present invention relates to a socket connector, and more particularly, to a socket connector having a connector housing with ends slightly lifted off to provide a deformation free configuration in use.

2. Description of Prior Art

U.S. Pat. No. 7,189,093 issued to Ma on Mar. 13, 2007 discloses an electronic socket, which comprises a plurality of conductive terminals received in an insulative housing, a stiffener surrounding the housing, a load plate pivotably assembled with one end of the stiffener and a load lever pivotably attached to the other end of the stiffener. The stiffener defines a plurality of semi-circular slits at the two ends of a window thereof. Bottom walls of the housing define a plurality of semi-cylindrical protrusions corresponding to the semi-circular slits. By virtue of the engagement of the semi-cylindrical protrusions and the semi-circular slits, the stiffener body is assembled with the housing completely.

However, Ma's art has its limitation. In use, stress is concentrated mainly on area where the located/load lever is pivotably attached the stiffener. When the electrical package is mounted into the receiving cavity of the housing, the load plate will be locked onto the stiffener by the load lever, so as to secure the electrical package in the housing. During above process, middle portion of the stiffener will be deformed downwardly under the operational force, and the two ends of the stiffener will be deformed upwardly. Accordingly, because the housing is mechanically engaged with the window of the stiffener, the housing may be curved under the force. Accordingly, solder ball disposed on a periphery region of the bottom wall of the housing may be stretched under condition that the housing is deformed. If so, reliability of the electrical socket is destroyed inadvertently effected.

In view of the above, an improved electrical socket that overcomes the above-mentioned disadvantages is desired.

SUMMARY OF THE INVENTION

Accordingly, an object of the present invention is to provide a socket connector, and more particularly, to a socket connector having a connector housing with ends slightly lifted off to provide a deformation free configuration in use.

To achieve the above-mentioned object, an electrical socket connector in accordance with a preferred embodiment of the present invention for electrically connecting an electronic package with a PCB is provided. The electrical socket comprises an insulative housing, a stiffener defined around the insulative housing, a load plate and a load lever. The housing defines two supporting portions at two opposite sides, each of said supporting portions defining a mounting portion in a middle portion thereof. The stiffener comprises a first side, a second side opposite to the first side, a third side and a fourth side opposite to the third side, the third, fourth sides defined corresponding to the two supporting portions of the housing respectively and with an engaging portion engageable with the mounting portion, each of said third, fourth sides formed with an upward curved configuration at a middle portion thereof for supporting the supporting portion. The two supporting portions seat on the third, fourth sides respectively, thus making a gap formed between the supporting portions and opposite end of corresponding sides respectively. In other words, two opposite ends are slightly lifted off relative to the stiffener to provide a deformation free configuration in use.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Figure 1:
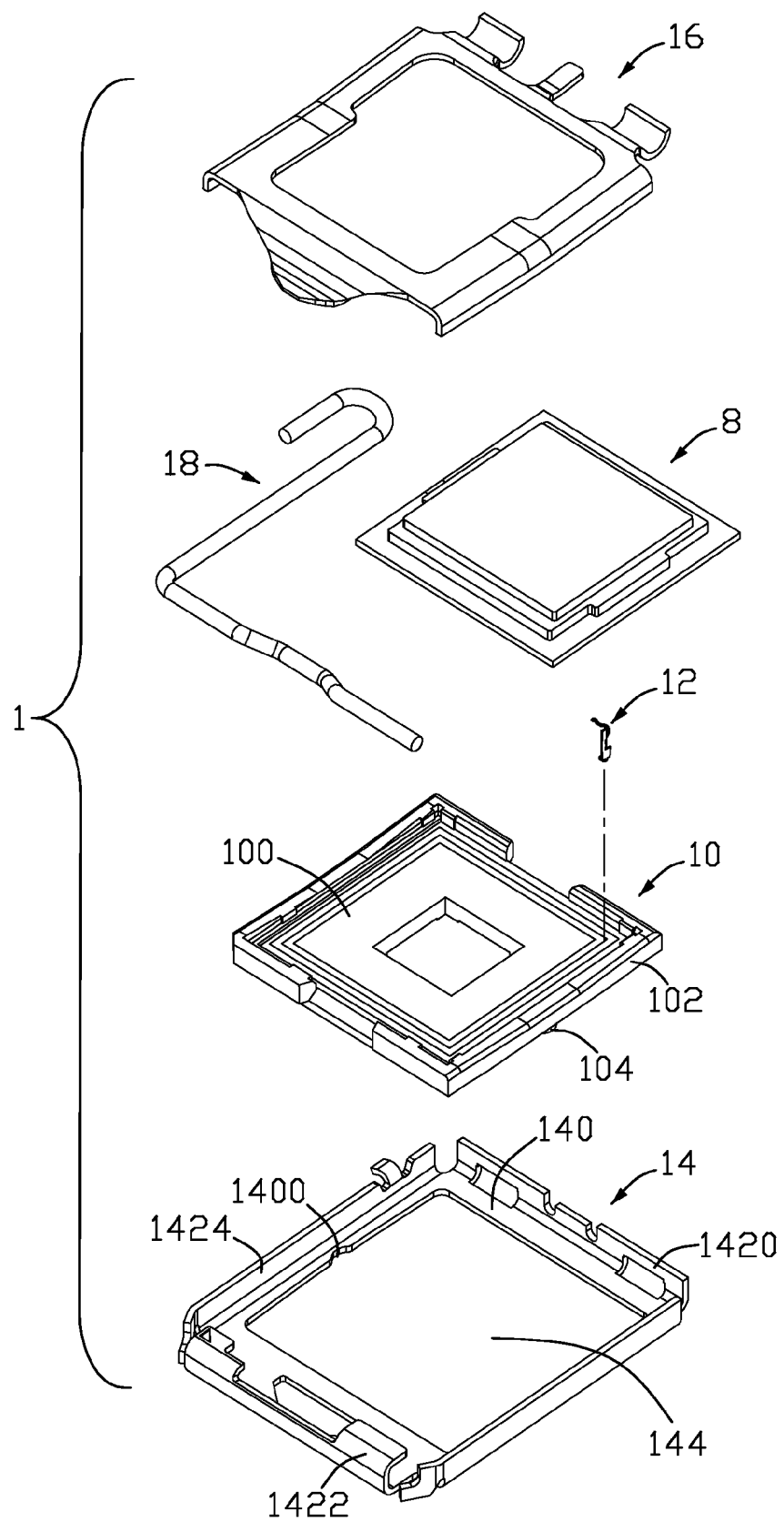
FIG. 1 is an isometric, exploded view of an electrical socket in accordance with a preferred embodiment of the present invention.

Reference will now be made to the drawings to describe the present invention in detail.

Referring to FIGS. 1-5, a socket connector 1 in accordance with a preferred embodiment of the present invention is used for electrically connecting an electrical package 8 with a PCB (not shown). The socket connector 1 comprises an insulative housing 10 having a plurality of contact 12, a stiffener 14 seated around the housing, and a load plate 16 and a load lever 18 engaged on opposite sides of the stiffener, respectively.

Figure 2:
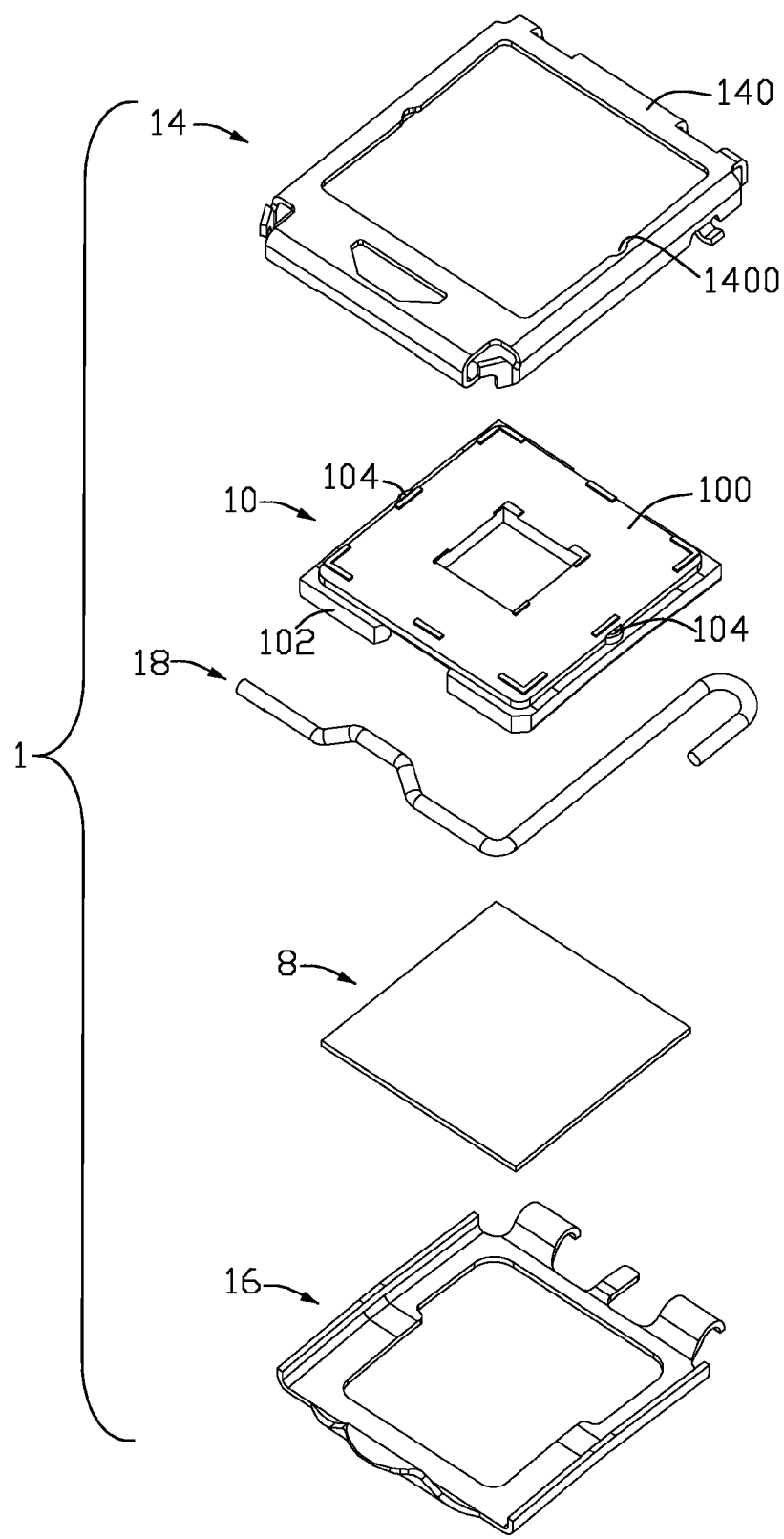
FIG. 2 is an isometric, exploded view of an electrical socket in accordance with a preferred embodiment of the present invention.
Figure 3:
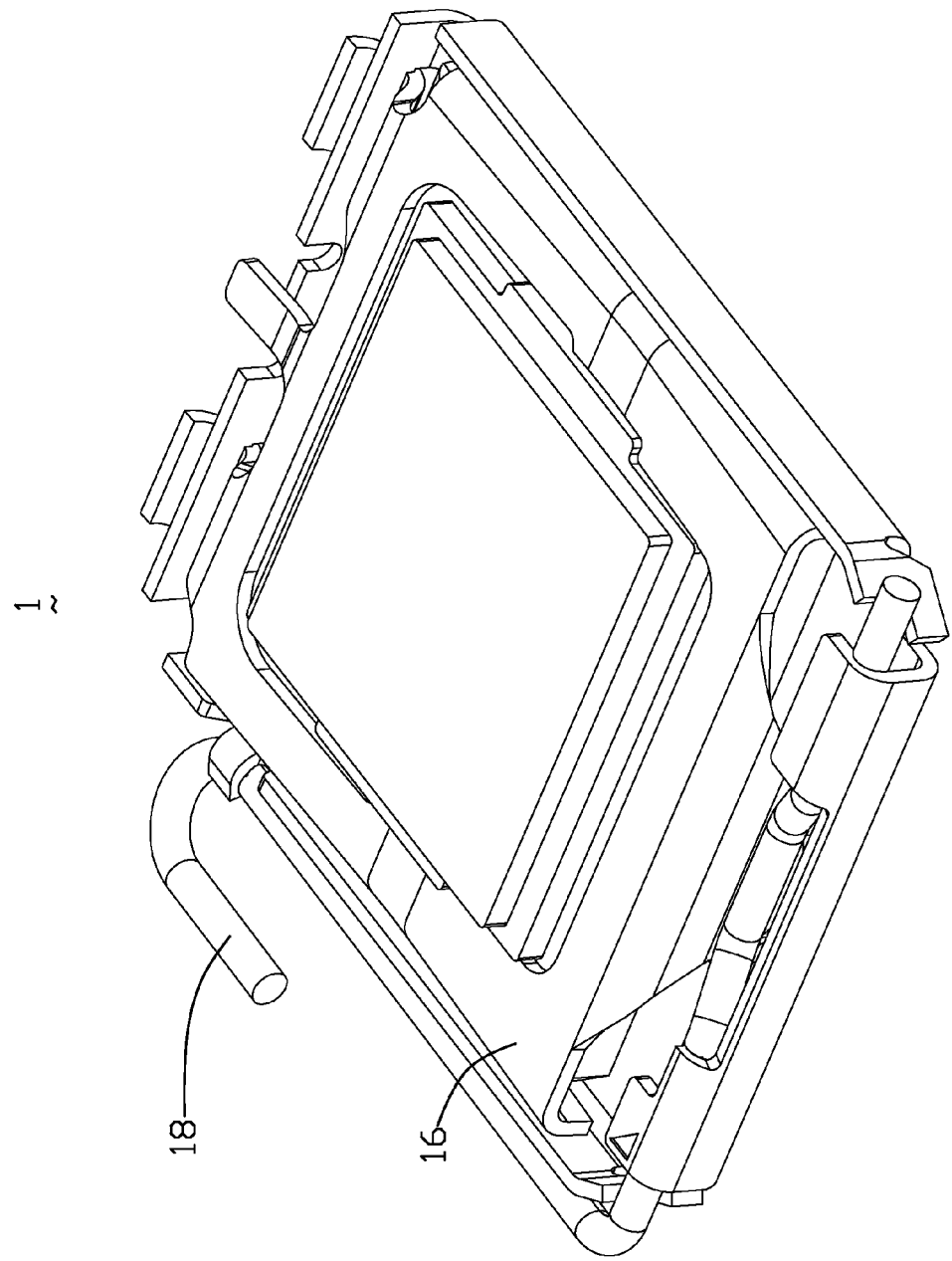
FIG. 3 is an isometric, exploded view of the electrical socket in accordance with a preferred embodiment of the present invention.
Figure 4:
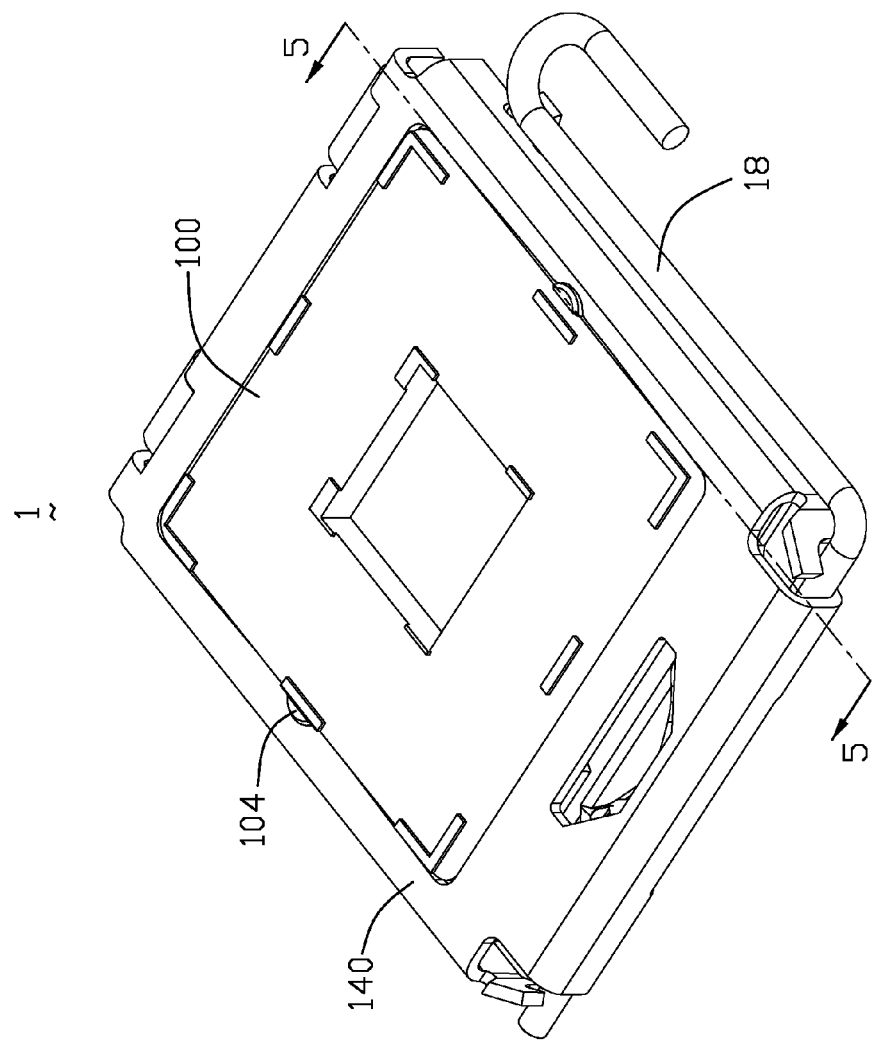
FIG. 4 is an isometric, exploded view of the electrical socket in accordance with a preferred embodiment of the present invention.

Referring to FIGS. 1-2, the insulative housing 10 comprises a base 100 and a supporting portion 102 extending outwardly from peripheral of the base to form a pair of first steps and a pair of second steps respectively. Two opposite sides of the base 100 each define a pair of mounting portion 104 in a middle portion thereof, which are located below the first steps. In this embodiment, the mounting portion 104 is a semi-cylindrical protrusion 104.

Referring to FIGS. 1-2, the stiffener comprises a first side, a second side opposite to the first side, a third side and a fourth side opposite to the third side. The four sides form a bottom plate 140, which defines a window for receiving the base 100 of the housing 10. A plurality of sidewalls extends upwardly from the bottom plate 100. Sidewall on the first side forms a first pivoted end 1420 for engaging with the load plate 16, and sidewall on the second side forms a second pivoted end 1422 for engaging with the load lever 16. Sidewalls of the third, fourth sides form a wing 142.

Figure 5:
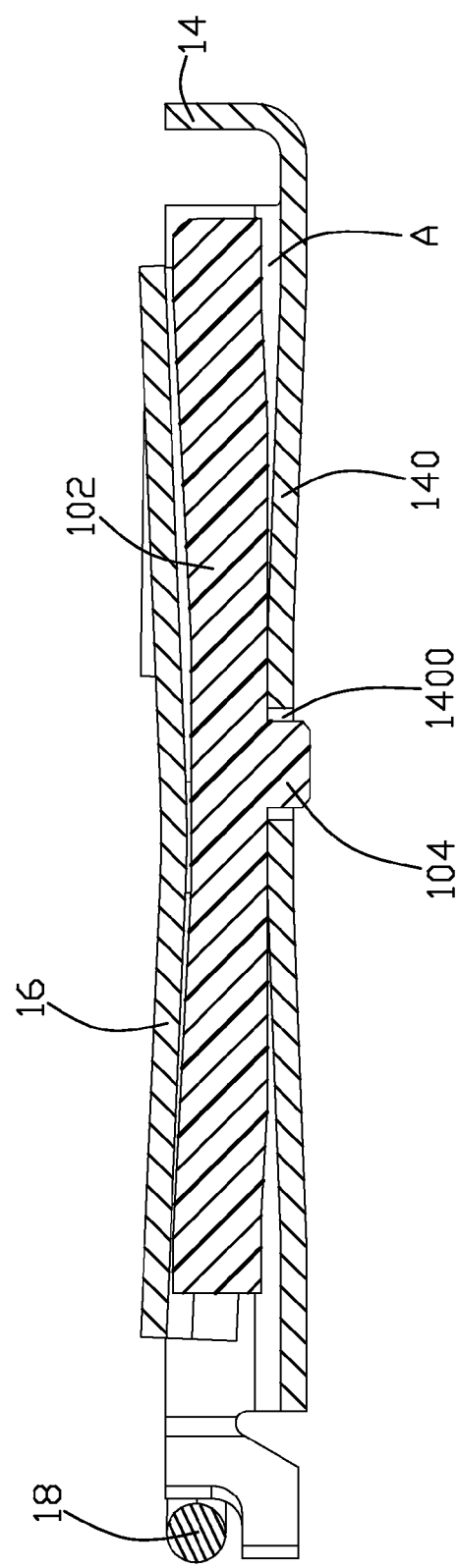
FIG. 5 is a cross-section view taken along line 5-5 in FIG. 4.

The third, fourth sides are corresponding to the two first steps that are located above the mounting portions 104. Referring to FIG. 5, each of the third and fourth side is formed with an upwardly curved configuration at a middle portion thereof for abutting against the first step, respectively. Furthermore, each of the two sides defines an engaging portion 1400 corresponding to the mounting portion 104. In this embodiment, the engaging portion 140 is a semi-circular slit.

When the insulative housing 10 is assembled with other components, the base 100 of the insulative housing 10 is received in the window 144 of the bottom plate 140 of the stiffener 14 and the supporting portion 102 (both of the first, second steps) seats on the upper surface of the bottom plate 140. The engaging portion 140 engages with the mounting portion 104 to retain the housing 10 thereof. Referring to FIG. 5, because only middle portion of the third, fourth sides are deformed upwardly, a gap A is formed between the supporting portion 102 (first, second steps) and the bottom plate 140. In other words, each of the first, second sides and the second step defines a gap therebetween. Of course, opposite ends of each of the first, second sides and the first step also define a gap therebetween. In this embodiment, the gap is tapered along a first side-to-second side direction.

When the load lever 16 is actuated to press the electrical package 8 downwardly, the load lever 16 simultaneously pulls up the end of the stiffener 14 thereat to counterbalance the pressing forces. In addition, the load plate 18 tend to pull up the first, second pivoted ends 1420, 1422 of the stiffener 4 thereat, to counterbalance the pressing forces of the load plate 18.

The pulling up forces operates on the opposite ends of the stiffener 14 respectively, and the pressing forces from the load plate 18 operate to press a center portion of the electrical package 8. Thus, the stiffener 2 tends to bend upward in the two ends that engage with the load plate 18 and load lever 16. Because of the gap A, the ends of the stiffener 3 have enough room to bend, and will not push the housing 1 to distort upwardly. Therefore, the distortion of the housing 1s diminished, and reliable electrical connecting performance can be achieved.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket connector comprising:
an insulative housing comprising a base and two supporting portions extending outwardly from two opposite sides of the base respectively, each of sides of the base defining a mounting portion in a middle portion thereof and located below corresponding supporting portion;
a stiffener comprising a first side, a second side opposite to the first side, a third side and a fourth side opposite to the third side, the four sides of the stiffener defining a widow for receiving the base, the third, fourth sides defined corresponding to the two supporting portions of the housing respectively and with an engaging portion engageable with the mounting portion of the base;
a load plate engaged in the first side of the stiffener;
a load lever engaged in the second side of the stiffener; and
wherein the two supporting portions seat on the third, fourth sides respectively, each of said third, fourth sides formed with an upwardly curved configuration at a middle portion thereof for supporting the supporting portions thus making a gap formed between the supporting portions and opposite end of corresponding sides respectively.

2. The socket connector as claimed in claim 1, wherein the engaging portion is semi-circular slit and the mounting portion is semi-cylindrical protrusion.

3. The socket connector as claimed in claim 1, wherein the gap is tapered.

4. An socket connector comprising:
an insulative housing defining a base and a supporting portion extending outwardly from peripheral of the base to form a pair of first steps and a pair of second steps;
a stiffener comprising a bottom plate and a plurality of sidewalls extending upwardly from the bottom plate, the bottom defining a widow receiving the base;
a load plate pivotably engaging with one sidewall of the stiffener;
a load lever pivotably engaging with an opposite sidewall of the stiffener;
wherein the first, second steps are located above an upper surface of the bottom plate and the second steps is arranged corresponding to two opposite ends of the stiffener that engage the load plate and the load lever respectively, the bottom plate formed with an upwardly curved configuration at a middle portion thereof for abutting against the first steps, so as to form a gap between each second steps and the bottom plate.

5. The socket connector as claimed in claim 4, wherein the first steps define a pair of protrusions, corresponding edges of the widow of the bottom define a pair of the slits for engaging with the protrusions.

6. The socket connector as claimed in claim 4, wherein the gap is tapered.

7. A socket connector, comprising:
a stiffener having a base with a window defined thereof and a first end and a second end;
a connector housing disposed in the window and having an engagement substantially in a middle of sides of the window and having ends of the housing located above an upper surface of the base of the stiffener;
a load plate pivotally attached to a first end of the stiffener; and
a lever pivotally assembled to the second end to press the load plate toward the stiffener;
wherein the first end and the second end of said stiffener are lower than a middle region of the stiffener where the engagement of the housing is positioned, so as to relatively lift up the ends of the housing above the surface of the base of the stiffener for forming a gap therebetween.

8. The socket connector as claimed in claim 7, wherein said middle region is upwardly curved relative to said first end and said second end.

9. The socket connector as claimed in claim 7, wherein an underside of the end of the housing is cut off to correspond to one of said first and second ends for enlarging said gap therebetween.

* * * * *